(12) United States Patent
Nishikawa et al.

(10) Patent No.: US 12,072,387 B2
(45) Date of Patent: *Aug. 27, 2024

(54) BATTERY STATE ESTIMATION DEVICE, BATTERY STATE ESTIMATION METHOD, AND BATTERY SYSTEM

(71) Applicant: Panasonic Intellectual Property Management Co., Ltd., Osaka (JP)

(72) Inventors: Shinya Nishikawa, Osaka (JP); Takashi Iida, Hyogo (JP); Tohru Watanabe, Gifu (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 457 days.

This patent is subject to a terminal disclaimer.

(21) Appl. No.: 17/311,370

(22) PCT Filed: Nov. 13, 2019

(86) PCT No.: PCT/JP2019/044534
§ 371 (c)(1),
(2) Date: Jun. 7, 2021

(87) PCT Pub. No.: WO2020/129477
PCT Pub. Date: Jun. 25, 2020

(65) Prior Publication Data
US 2022/0026497 A1   Jan. 27, 2022

(30) Foreign Application Priority Data
Dec. 18, 2018 (JP) .................. 2018-236657

(51) Int. Cl.
*G01R 31/3842* (2019.01)
*G01R 31/36* (2020.01)
(Continued)

(52) U.S. Cl.
CPC ..... *G01R 31/3842* (2019.01); *G01R 31/3648* (2013.01); *G01R 31/367* (2019.01);
(Continued)

(58) Field of Classification Search
CPC ........... G01R 31/3842; G01R 31/3648; G01R 31/367; G01R 31/385; G01R 31/388;
(Continued)

(56) References Cited

U.S. PATENT DOCUMENTS

| | | | |
|---|---|---|---|
| 2015/0084639 A1* | 3/2015 | Joe | G01R 31/3842 324/426 |
| 2019/0023132 A1 | 1/2019 | Yonemoto et al. | |
| 2022/0120817 A1* | 4/2022 | Okada | B60L 58/10 |

FOREIGN PATENT DOCUMENTS

| | | | | |
|---|---|---|---|---|
| CN | 104541175 A | | 4/2015 | |
| JP | WO 2012095913 | * | 7/2012 | ........... G01R 31/392 |

(Continued)

OTHER PUBLICATIONS

International Search Report of PCT application No. PCT/JP2019/044534 dated Feb. 4, 2020.
(Continued)

*Primary Examiner* — Alexander Satanovsky
(74) *Attorney, Agent, or Firm* — Rimon P.C.

(57) ABSTRACT

A voltage of a battery cell is measured, and a current flowing through the battery cell is measured. An open circuit voltage (OCV) of the battery cell is estimated based on the measured voltage, the measured current, and an equivalent circuit model based on electrochemistry of the battery cell. At least one of a positive electrode and negative electrode of the battery cell is a mixed electrode containing a plurality of materials. The equivalent circuit model is a model including (Continued)

a diffusion resistance component for each of the plurality of materials for use in the positive electrode and the negative electrode.

5 Claims, 7 Drawing Sheets

(51) Int. Cl.
    *G01R 31/367*      (2019.01)
    *G01R 31/385*      (2019.01)
    *H01M 4/485*      (2010.01)
    *H01M 10/0525*      (2010.01)
    *H01M 10/48*      (2006.01)

(52) U.S. Cl.
    CPC .......... *G01R 31/385* (2019.01); *H01M 4/485* (2013.01); *H01M 10/48* (2013.01); *H01M 10/482* (2013.01); *H01M 10/0525* (2013.01)

(58) Field of Classification Search
    CPC .... H01M 4/485; H01M 10/48; H01M 10/482; H01M 10/0525; H01M 4/133; H01M 4/134; H01M 4/364; H01M 4/386; H01M 2220/20; H01M 4/587; Y02E 60/10; H02J 7/00
    See application file for complete search history.

(56) References Cited

FOREIGN PATENT DOCUMENTS

| | | | | |
|---|---|---|---|---|
| JP | 2014-102111 | 6/2014 | | |
| JP | 2017-162661 | 9/2017 | | |
| JP | WO 2017159031 | * | 9/2017 | ........ H02J 7/007194 |
| JP | 2018-031795 | 3/2018 | | |

OTHER PUBLICATIONS

English Translation of Chinese Office Action dated May 21, 2024 for the related Chinese Patent Application No. 201980084019.X.

* cited by examiner (a)

(b)

(a)                                    (b)

(a)

(b)

BATTERY STATE ESTIMATION DEVICE, BATTERY STATE ESTIMATION METHOD, AND BATTERY SYSTEM

CROSS-REFERENCE TO RELATED APPLICATIONS

This application is a U.S. national stage application of the PCT International Application No. PCT/JP2019/044534 filed on Nov. 13, 2019, which claims the benefit of foreign priority of Japanese patent application No. 2018-236657 filed on Dec. 18, 2018, the contents all of which are incorporated herein by reference.

TECHNICAL FIELD

The present invention relates to a battery state estimation device, a battery state estimation method, and a battery system for estimating a state of a battery cell such as a lithium-ion battery.

BACKGROUND ART

In a secondary battery such as a lithium-ion battery, it is required to accurately estimate a state of charge (SOC). Generally, the SOC is uniquely associated with an open circuit voltage (OCV). Particularly, in a secondary battery mounted on an electrified vehicle such as a hybrid vehicle (HV), a plug-in hybrid vehicle (PHV), and an electric vehicle (EV), it is important to accurately estimate the SOC and the OCV for obtaining the SOC in order to accurately grasp a travelable distance.

The secondary battery is an electrochemical product, in which a measured voltage rises nonlinearly when a charging current flows therethrough, and the measured voltage drops nonlinearly when a discharging current flows therethrough. A voltage measured when a current flows through the secondary battery is referred to as a closed circuit voltage (CCV) or an operating voltage. In a general lithium-ion battery cell, the measured voltage converges to the vicinity of the OCV, which does not contain an overvoltage component, in about 30 seconds after the end of charge-discharge. Hence, even if the measured voltage after the elapse of 30 seconds from the end of charge-discharge is treated as the OCV, the accuracy of the OCV is maintained.

In recent years, a lithium-ion battery cell using a negative electrode mixed with silicon (Si) has been developed. In the lithium-ion battery cell, a depolarization time is longer than that in a general cell, and it takes 10 hours or more for the measured voltage to converge to the OCV after the end of charge-discharge. In this case, the OCV cannot be measured during use of the electrified vehicle, and the estimation accuracy of the SOC decreases. Moreover, even in a general battery cell, the time taken for the measured voltage to converge to the OCV becomes longer than usual at a low temperature or in a state where a deterioration has progressed.

A method is disclosed, which is for modeling a secondary battery by an equivalent circuit of an OCV, a negative electrode, a positive electrode, and diffusion, estimating polarization (diffusion) characteristics, and estimating the OCV (see, for example, PTLs 1 and 2).

CITATION LIST

Patent Literature

PTL 1: Unexamined Japanese Patent Publication No. 2014-102111

PTL 2: Unexamined Japanese Patent Publication No. 2017-162661

SUMMARY OF THE INVENTION

However, in the conventional equivalent circuit model, when an electrode in which a plurality of materials are mixed with one another is used, the estimation accuracy of the OCV has decreased.

The present invention has been made in view of such a circumstance, and an object thereof is to provide a technique for improving the estimation accuracy of the OCV of the secondary battery using the electrode in which the plurality of materials are mixed with one another.

In order to solve the above problem, a battery state estimation device according to a certain aspect of the present invention includes: a voltage measuring unit that measures a voltage of a battery cell; a current measuring unit that measures a current flowing through the battery cell; and a controller that estimates an open circuit voltage (OCV) of the battery cell based on a voltage measured by the voltage measuring unit, a current measured by the current measuring unit, and an equivalent circuit model based on electrochemistry of the battery cell. At least one of a positive electrode and negative electrode of the battery cell is a mixed electrode containing a plurality of materials, and the equivalent circuit model is a model including a diffusion resistance component for each of a plurality of materials for use in the positive electrode and the negative electrode.

Note that any desired combinations of the above-described constituent elements and modifications of the features of the present invention in methods, devices, systems, computer programs, or other entities are still effective as other aspects of the present invention.

In accordance with the present invention, the estimation accuracy of the OCV of the secondary battery using the electrode in which the plurality of materials are mixed with one another can be improved.

DESCRIPTION OF EMBODIMENT

Figure 1:
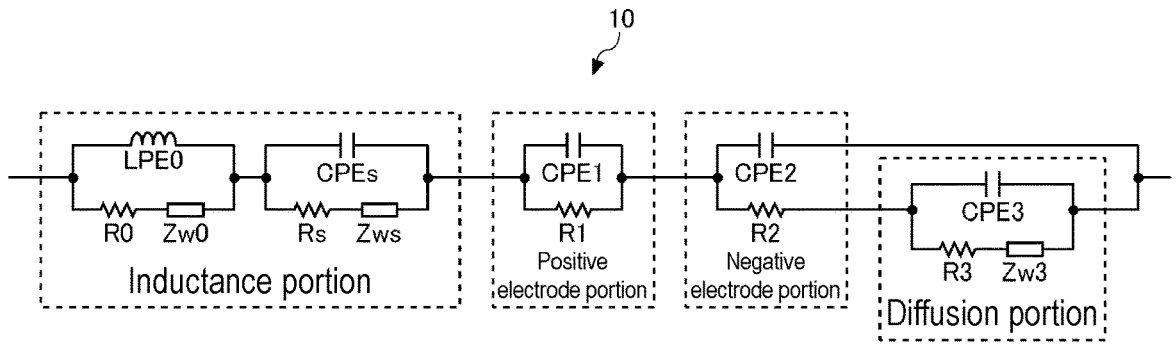
FIG. 1 is a diagram illustrating an example of an equivalent circuit model of a general battery cell.

FIG. 1 is a diagram illustrating an example of an equivalent circuit model of general battery cell 10. An equivalent circuit of battery cell 10 illustrated in FIG. 1 is composed of four equivalent circuits, which are: an inductance portion derived from an electrode structure of battery cell 10; a positive electrode portion derived from a positive electrode reaction; a negative electrode portion derived from a negative electrode reaction; and a diffusion portion derived from movement of ions of a positive electrode and a negative electrode. LPEO indicates an inductance component, R0, Rs, R1, R2, and R3 indicate resistance components, CPEs, CPE1, CPE2, and CPE3 indicate capacitance components, and Zw0, Zws, and Zw3 represent Warburg impedance components.

In the present exemplary embodiment, assumed below will be an example of using, as battery cell 10, a lithium-ion battery cell using lithium cobaltate (LiCoO2) for the positive electrode and a mixed material of graphite (C) and silicon (Si) for the negative electrode. In the lithium-ion battery cell in which the negative electrode mixed with silicon (Si) is used, a time until a measured voltage (observed voltage) converges to an OCV after charge-discharge is stopped becomes long. Thus, an estimated error of an SOC estimated based on the measured voltage before the convergence also increases.

In such a model with one diffusion portion as illustrated in FIG. 1, it is difficult to express a waveform of the voltage convergence curve after the charge-discharge is stopped. The voltage convergence curve after the charge-discharge is stopped can be expressed by a combined voltage waveform corresponding to diffusion resistance components of respective materials, but in such a model with one diffusion portion as illustrated in FIG. 1, a combined voltage corresponding to the diffusion resistance components of the respective materials cannot be derived.

In contrast, in the present exemplary embodiment, an equivalent circuit model is used, which expresses the diffusion resistance component for each material, and is thereby capable of expressing a combined waveform of voltages corresponding to the diffusion resistance components of the respective materials.

Figure 2:
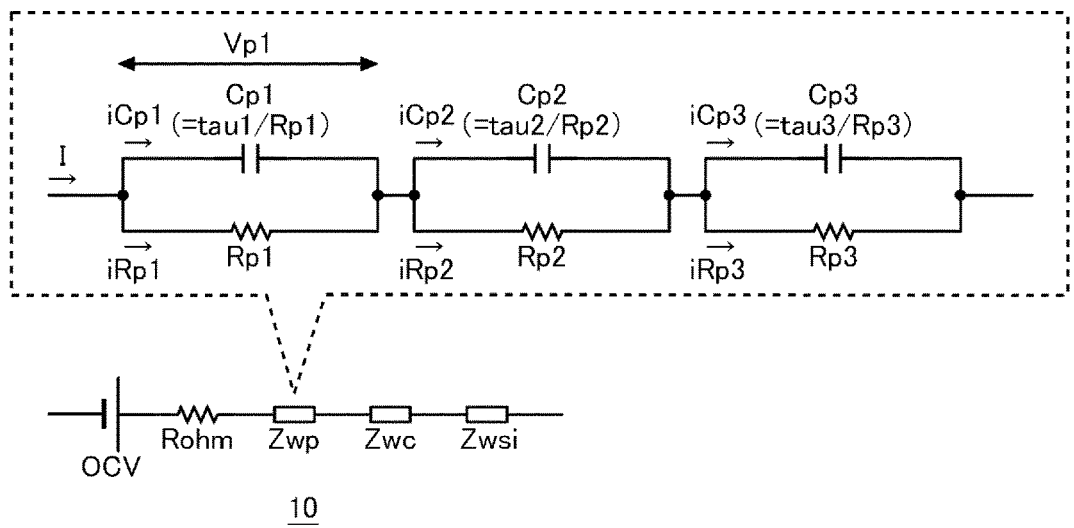
FIG. 2 is a diagram illustrating a first example of an equivalent circuit model of a battery cell according to the present exemplary embodiment.

FIG. 2 is a diagram illustrating a first example of the equivalent circuit model of battery cell 10 according to the present exemplary embodiment. The equivalent circuit model illustrated in FIG. 2 is an equivalent circuit model in which the diffusion resistance components of the respective materials are simply arranged in series. The equivalent circuit model illustrated in FIG. 2 can be defined by the following (Equation 1).

$$OCV = CCV - I*Rohm - Vpp - Vpc - Vpsi \quad \text{(Equation 1)}$$

CCV is an observed voltage of battery cell 10, which is measured. I is an observed current of battery cell 10, which is measured. Rohm is a resistance component that collectively expresses a reaction resistance, conduction resistance, current collector resistance, and the like of lithium (Li). Zwp indicates a diffusion resistance component of lithium (Li) in a positive electrode active material, Zwc indicates a diffusion resistance component of lithium (Li) in a negative electrode active material (graphite (C)), and Zwsi indicates a diffusion resistance component of lithium (Li) in a negative electrode active material (silicon (Si)). Vpp indicates polarization voltage Vp applied to Zwp, Vpc indicates polarization voltage Vp applied to Zwc, and Vpsi indicates polarization voltage Vp applied to Zwsi.

In the following description of the equivalent circuit model, it is assumed that respective parameters which are R, C, and Zw have been tuned to values, which consider temperature dependencies thereof, according to an operating environment.

Each of the diffusion resistance components is expressed by a Warburg impedance, and is known to be capable of being approximated by a sum of infinite series of RC parallel circuits as in the following (Equation 2).

$$Zw(s) = \Sigma_{n=1 \text{ to } \infty}(Rn/(sCnRn+1)) \quad \text{(Equation 2)}$$

$$Cn = Cd/2, Rn = 8Rd/((2n-1)^2\pi^2)$$

A time constant is $(2n-1)^2$, and decreases as an order thereof increases. In the case of using the time constant in computational processing on the order of seconds, approximately third to fifth order is basically sufficient.

Each of the diffusion resistance components can be approximated by a Foster-type circuit as shown in the above (Equation 2). FIG. 2 illustrates an example of approximating each of the diffusion resistance components by a third-order Foster-type circuit. In each of RC parallel circuits of the Foster-type circuit, a relationship shown in the following (Equation 3) is established. The following (Equation 3) illustrates an RC parallel circuit at a first stage of the Foster-type circuit of FIG. 2.

$$(dVp1/dt) = (I/Cp1) - (Vp1/tau1) \quad \text{(Equation 3)}$$

$$iCp1 = Cp1(dVp1/dt), iRp1 = Vp1/Rp1, I = iCp1 + iRp1,$$
$$tau1 = Cp1*Rp1$$

When parameters which are Rp1 and Cp1 at a first stage of the above (Equation 3) are determined, parameters (Rp2, Cp2, Rp3, Cp3) at a subsequent stage thereof are also automatically determined. In each of the RC parallel circuits at a second stage and a third stage, a similar relational equation to the above (Equation 3) of the RC parallel circuit at the first stage is established. That is, from the above (Equation 2), Cp1=Cp2=Cp3, Rp2=1/9*Rp1, and Rp3=1/25*Rp are satisfied.

Based on the above (Equation 2) and (Equation 3), by using observed current I as an input, polarization voltage Vpp applied to Zwp, polarization voltage Vpc applied to Zwc, and polarization voltage Vpsi applied to Zwsi can be calculated. The OCV can be estimated by substituting the calculated Vpp, Vpc and Vpsi for the above (Equation 1). In the case of estimating the OCV after the charge-discharge is stopped, 0 is substituted for I.

Figure 3:
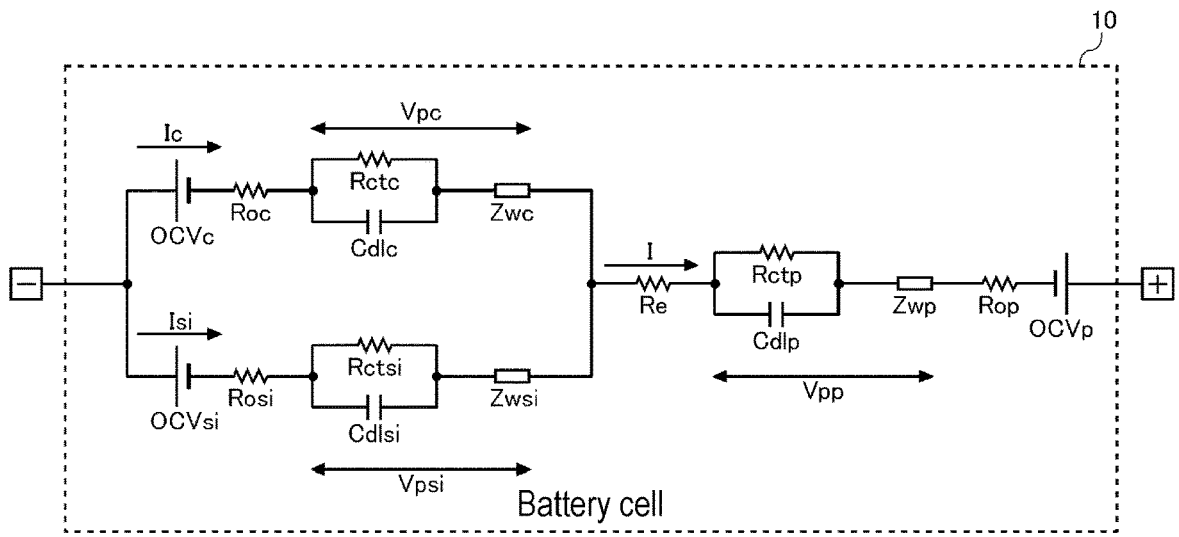
FIG. 3 is a diagram illustrating a second example of the equivalent circuit model of the battery cell according to the present exemplary embodiment.

FIG. 3 is a diagram illustrating a second example of the equivalent circuit model of battery cell 10 according to the present exemplary embodiment. In the equivalent circuit model illustrated in FIG. 3, an equivalent circuit is defined for each material, and an electrode in which a plurality of materials are mixed with one another is defined by a parallel circuit of equivalent circuits of the respective materials. In the present exemplary embodiment, a negative electrode is defined by a parallel circuit of an equivalent circuit of a graphite (C) negative electrode and an equivalent circuit of a silicon (Si) negative electrode.

In FIG. 3, Ro indicates a DC resistance component of a lead resistor or the like. Rct indicates a charge transfer resistance component associated with an electrode reaction. Cdl indicates a capacitance component corresponding to charge of an electric double layer. Re indicates a transfer resistance component (electrolytic solution resistance) in an electrolyte. Zw (Zwc, Zwsi, Zwp) indicates a diffusion resistance component, and as in the first example, is expressed by a Warburg impedance, and is approximated by a third-order Foster-type circuit.

A voltage applied to both sides of a series circuit of Zwc and a parallel circuit of Rctc and Cdlc indicates polarization voltage Vpc of the graphite (C) negative electrode. Likewise, a voltage applied to both sides of a series circuit of Zwsi and a parallel circuit of Rctsi and Cdlsi indicates polarization voltage Vpsi of the silicon (Si) negative electrode. Likewise, a voltage applied to both sides of a series circuit of Zwp and a parallel circuit of Rctp and Cdlp indicates polarization voltage Vpp of the positive electrode.

Using the above (Equation 2) and (Equation 3), the polarization voltage applied to Zwp can be calculated based on observed current I. The polarization voltage applied to Zwc can be calculated based on current Ic flowing through the graphite (C). The polarization voltage applied to Zwsi can be calculated based on current Isi flowing through the silicon (Si). Current Ic flowing through the graphite (C) and current Isi flowing through the silicon (Si) can be calculated by solving, as a simultaneous equation, equations shown in the following (Equations 4) to (Equation 6).

As in the RC parallel circuit that constitutes a Foster-type circuit, also in the parallel circuit of Rct and Cdl, if parameters which are Rct and Cdl (which may be tau instead of Cdl) are determined, a polarization voltage applied to both sides of the parallel circuit of Rct and Cdl can be calculated using the above (Equation 3). Specifically, the polarization voltage applied to both sides of the parallel circuit of Rctp and Cdlp can be calculated based on observed current I. Based on current Ic flowing through graphite (C), the polarization voltage applied to both sides of the parallel circuit of Rctc and Cdlc can be calculated. The polarization voltage applied to both sides of the parallel circuit of Rctsi and Cdlsi can be calculated based on current Isi flowing through silicon (Si).

Polarization voltage Vpc of the graphite (C) negative electrode can be calculated by adding the polarization voltage applied to both sides of the parallel circuit of Rctc and Cdlc and the polarization voltage applied to Zwc. Likewise, polarization voltage Vpsi of the silicon (Si) negative electrode can be calculated by adding the polarization voltage applied to both sides of the parallel circuit of Rctsi and Cdlsi and the polarization voltage applied to Zwsi. Likewise, polarization voltage Vpp of the positive electrode can be calculated by adding the polarization voltage applied to both sides of the parallel circuit of Rctp and Cdlp and the polarization voltage applied to Zwp.

Since the equivalent circuit of the graphite (C) negative electrode and the equivalent circuit of the silicon (Si) negative electrode are parallel circuits, relationships in the following (Equation 4) and (Equation 5) are established.

$$OCV\_c(t)+Ic(t)*Roc(t)+Vpc(t-1)=OCV\_si(t)+Isi(t)*Rosi(t)+Vpsi(t-1) \quad \text{(Equation 4)}$$

$$Ic(t)+Isi(t)=I(t) \quad \text{(Equation 5)}$$

In order to simplify the calculation, previous values are used for the polarization voltage Vpc of the graphite (C) negative electrode and the polarization voltage Vpsi of the silicon (Si) negative electrode.

OCV_c in the above (Equation 4) can be derived as described below, and OCV_si can be derived from the following (Equation 6).

$$OCV\_c=OCV\_C\_LUT(Q\_c)$$

$$OCV\_si=OCV\_SI\_CHG\_LUT(Q\_si)*Xc(t-1)+OCV\_SI\_DIS\_LUT(Q\_si)*(1-Xc(t-1)) \quad \text{(Equation 6)}$$

OCV_C_LUT indicates a lookup table in which characteristic data of a Q-OCV curve of the graphite (C) negative electrode is described.

OCV_SI_CHG_LUT indicates a lookup table in which characteristic data of a Q-OCV curve on a charge side of the silicon (Si) negative electrode is described.

OCV_SI_DIS_LUT indicates a lookup table in which characteristic data of a Q-OCV curve on a discharge side of the silicon (Si) negative electrode is described.

Figure 4:
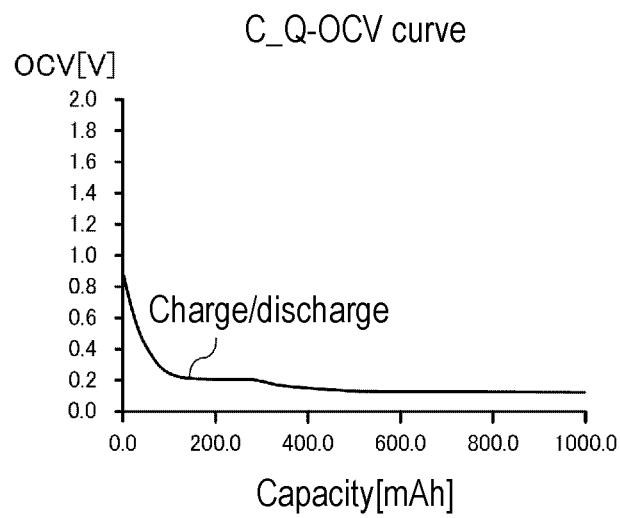
FIGS. 4($a$) and 4($b$) are diagrams showing an example of a Q-OCV curve of a graphite (C) negative electrode and a Q-OCV curve of a silicon monoxide (SiO) negative electrode.
Figure 4:
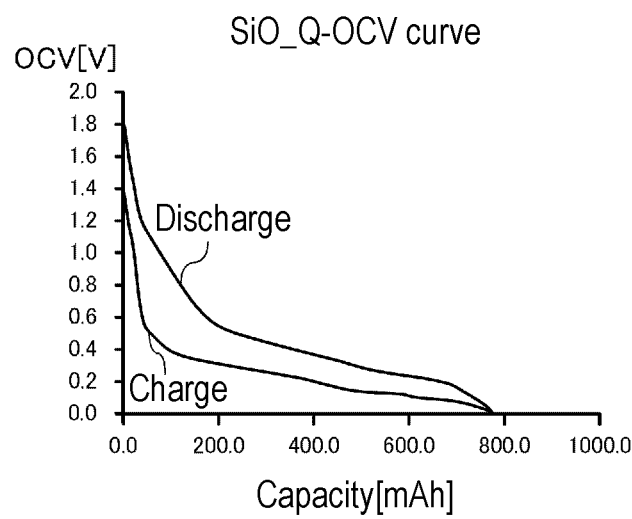

FIGS. 4(a) and 4(b) are diagrams showing examples of the Q-OCV curve of the graphite (C) negative electrode and a Q-OCV curve of a silicon monoxide (SiO) negative electrode. FIG. 4(a) shows an example of the Q-OCV curve of the graphite (C) negative electrode, and FIG. 4(b) shows an example of the Q-OCV curve of the silicon monoxide (SiO) negative electrode. In the example illustrated in FIG. 4(b), an example is described in which silicon monoxide (SiO) is used as a silicon (Si)-based material. Horizontal axes represent a capacity [mAh], and vertical axes represent OCV [V].

In the graphite (C) negative electrode, the Q-OCV curves during charge and discharge are substantially the same, and accordingly, are expressed by one curve. In the silicon monoxide (SiO) negative electrode, the Q-OCV curves during charge and discharge are different from each other, and accordingly, are expressed by two curves. OCV_C_LUT, OCV_SI_CHG_LUT, and OCV_SI_DIS_LUT are generated based on such Q-OCV curves as described above.

Q_c and Q_si can be derived from the following (Equation 7) and (Equation 8).

$$Q\_c=Q\_c\_init+\Sigma Ic/FCC\_c \quad \text{(Equation 7)}$$

$$Q\_si=Q\_si\_init+\Sigma Isi/FCC\_si \quad \text{(Equation 8)}$$

Q_c_init indicates an initial capacity of the graphite (C) negative electrode, Q_c indicates a current capacity of the graphite (C) negative electrode, and FCC_c indicates a full charge capacity of the graphite (C) negative electrode. Q_si_init indicates an initial capacity of the silicon (Si) negative electrode, Q_si indicates a current capacity of the silicon (Si) negative electrode, and FCC_si indicates a full charge capacity of the silicon (Si) negative electrode.

The initial capacity of the graphite (C) negative electrode and the initial capacity of the silicon (Si) negative electrode are set so as to have a relationship of OCV_c=OCV_si.

Xc in the above (Equation 6) is a parameter indicating a ratio of charge OCV and discharge OCV. A method for deriving Xc will be described below. In the lithium-ion battery cell using the mixed negative electrode of graphite (C) and silicon (Si), the SOC-OCV curve on the charge side and the SOC-OCV curve on the discharge side are different from each other. Particularly in a region where the SOC is 20% or less, the two are greatly deviated from each other, and hysteresis occurs when switching is performed from discharge to charge or from charge to discharge. Note that, in the case of the graphite (C) negative electrode alone, the SOC-OCV curves on the discharge side and the charge side are substantially the same, and accordingly, hysteresis does not occur at the time of switching charge and discharge.

Figure 5:
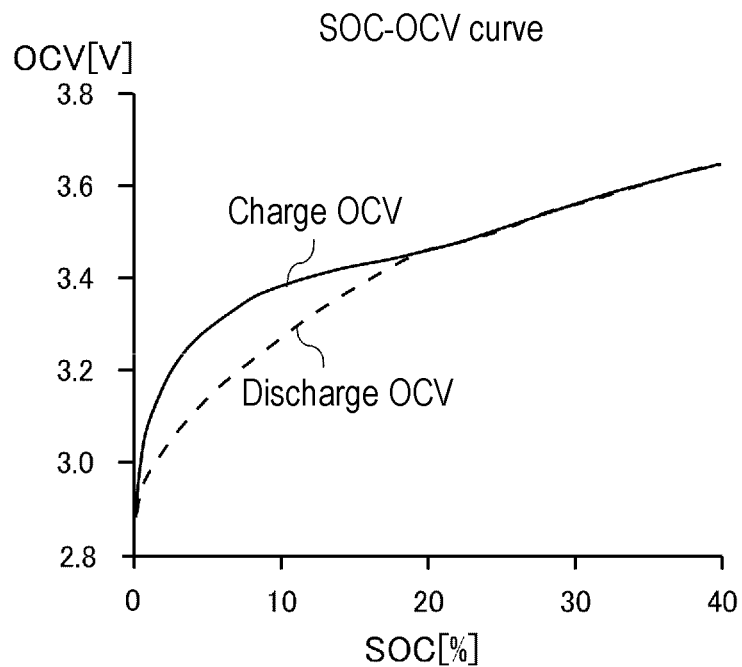
FIG. 5 is a diagram showing an example of SOC-OCV curves of a lithium-ion battery cell using a mixed negative electrode of graphite (C) and silicon (Si).

FIG. 5 is a diagram showing an example of the SOC-OCV curves of the lithium-ion battery cell using the mixed negative electrode of graphite (C) and silicon (Si). A horizontal axis represents the SOC [%], and a vertical axis represents the OCV [V]. A solid line indicates the SOC-OCV curve on the charge side, and a dotted line indicates the SOC-OCV curve on the discharge side.

In the region where the SOC is 20% or less, a deviation occurs between the SOC-OCV curve on the charge side and the SOC-OCV curve on the discharge side. In this region, an actual OCV converges to any point in a range surrounded by the SOC-OCV curve on the charge side and the SOC-OCV curve on the discharge side. The region where the SOC is 20% or less is a region where silicon (Si) is more likely to react than graphite (C), and an influence of transient characteristics of silicon (Si) increases.

Xc=0 indicates a case where the OCV is located on such a discharge OCV curve, and Xc=1 indicates a case where the OCV is located on such a charge OCV curve. 0<Xc<1 indicates a case where the OCV is located between the discharge OCV curve and the charge OCV curve. In order to estimate the SOC with high accuracy, it is necessary to appropriately obtain Xc indicating an intermediate ratio between the charge OCV and the discharge OCV.

A linear change of Xc can be derived from the following (Equation 9).

$$Xc\_line(t)=Xc(t-1)+a*dQ \quad \text{(Equation 9)}$$

An exponential change of Xc at the time of switching from discharge to charge can be derived from the following (Equation 10).

$$Xc\_exp\_CHG(t):(Xc(t)-Xc(t-1))/dQ=P*(1-Xc(t-1)+Xc(T)) \quad \text{(Equation 10)}$$

An exponential change of Xc at the time of switching from charge to discharge can be derived from the following (Equation 11).

$$Xc\_exp\_DIS(t):(Xc(t)-Xc(t-1))/dQ=P*(Xc(t-1)+1-Xc(T)) \quad \text{(Equation 11)}$$

a in the above (Equation 9) and P in the above (Equation 10) and (Equation 11) are coefficients, where values derived in advance by experiments or simulations are set. dQ indicates a capacitance change in a Δt period. When periodically (discretely) calculated by a microcomputer or the like, dQ is substantially equivalent to a current. In the present exemplary embodiment, current Isi flowing through silicon (Si) is used as a substitute for dQ.

T is a parameter representing a time when switching is performed between charge and discharge where Xc is an intermediate value (0.2, 0.5, or the like) between 0 and 1. Xc(T) holds a value of Xc(t) when switching is performed between charge and discharge, and a value thereof is updated only when such switching between charge and discharge is performed.

Figure 6:
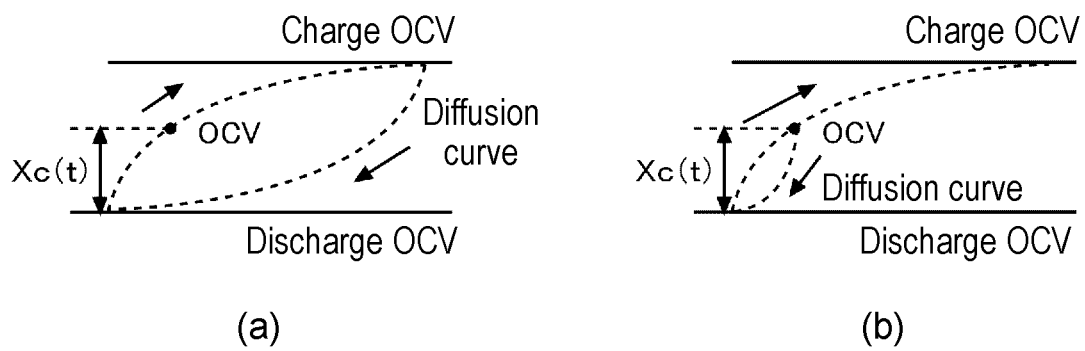
FIGS. 6($a$) and 6($b$) are diagrams for explaining transition of Xc(t).

FIGS. 6(a) and 6(b) are diagrams for explaining transition of Xc(t). FIG. 6(a) shows a trajectory of switching from charge to discharge and converging to the discharge OCV, that is, transition of Xc(t) when Xc(T)=1 in (Equation 11), and a trajectory of switching from discharge to charge and converging to the charge OCV, that is, transition of Xc(t) when Xc(T)=0 in (Equation 10). FIG. 6(b) shows a trajectory when another switching is performed from charge to discharge before switching is performed from discharge to charge and convergence to the charge OCV is made, that is, transition of Xc(t) when 0<Xc(T)<1 in (Equation 11).

Xc(t) can be derived from the following (Equation 12) or (Equation 13) at the time of charge or discharge, respectively.

$$Xc(t)=(X\_line(t)+Xc\_exp\_CHG(t))/2 \quad \text{(Equation 12)}$$

$$Xc(t)=(X\_line(t)+Xc\_exp\_DIS(t))/2 \quad \text{(Equation 13)}$$

The OCV of entire battery cell 10 illustrated in FIG. 3 can be estimated from the following (Equation 14).

$$OCV=CCV-I*Re-I*Rop-Vpp-Isi*Rosi-Vpsi \quad \text{(Equation 14)}$$

Since the equivalent circuit of the graphite (C) negative electrode and the equivalent circuit of the silicon (Si) negative electrode are parallel circuits, voltages applied to the two are basically the same. Note that, since the OCV also gradually changes due to polarization, a larger one of polarization voltage Vpc of the graphite (C) negative electrode and polarization voltage Vpsi of the silicon (Si) negative electrode is dynamically selected and used. Hence, 5th and 6th terms on a right side of the above (Equation 14) may sometimes be −Ic*Roc−Vpc.

The SOC of battery cell 10 illustrated in FIG. 3 can be estimated from the following (Equation 15).

$$SOC=OCV\_SOC\_CHG\_LUT(OCV)*Xc(t)+ \\ OCV\_SOC\_DIS\_LUT(OCV)*(1-Xc(t)) \quad \text{(Equation 15)}$$

OCV_SOC_CHG_LUT indicates a lookup table in which characteristic data of the SOC-OCV curve on the charge side of battery cell 10 illustrated in FIG. 3 is described.

OCV_SOC_DIS_LUT indicates a lookup table in which characteristic data of the SOC-OCV curve on the discharge side of battery cell 10 illustrated in FIG. 3 is described.

Figure 7:
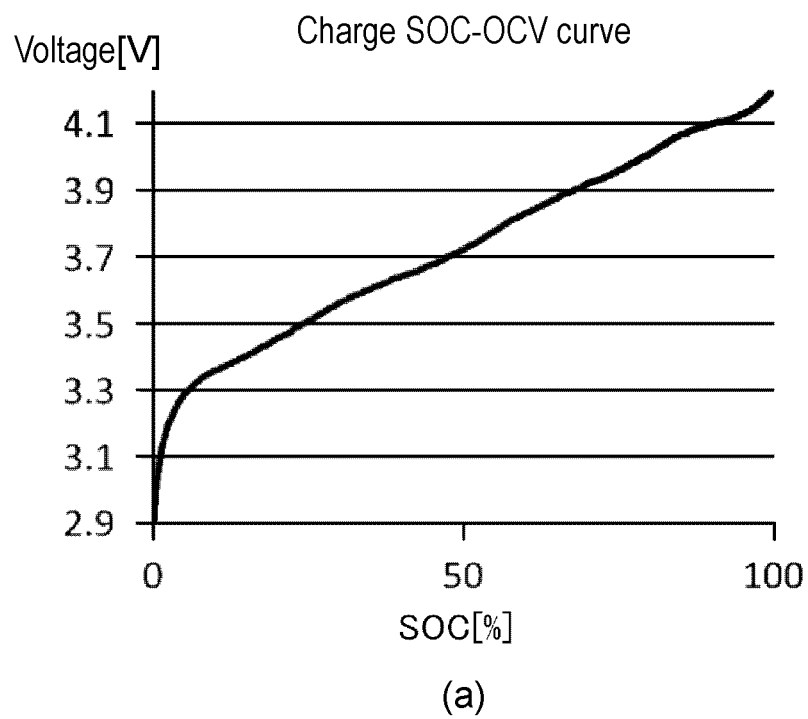
FIGS. 7($a$) and 7($b$) are diagrams showing an example of an SOC-OCV curve on a charge side and an SOC-OCV curve on a discharge side.
Figure 7:
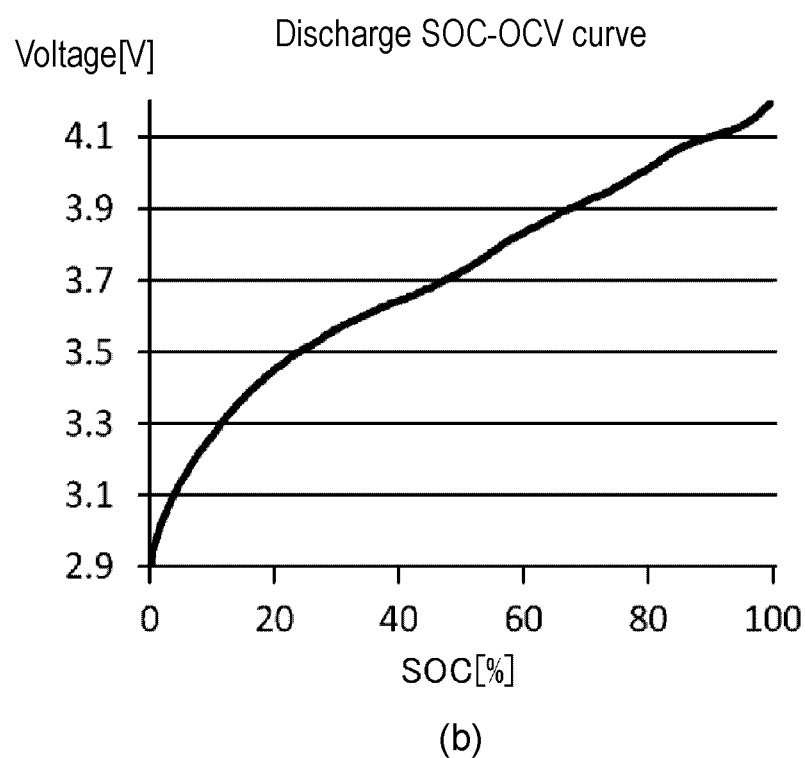

FIGS. 7(a) and 7(b) are diagrams showing examples of the SOC-OCV curve on the charge side and the SOC-OCV curve on the discharge side. FIG. 7(a) illustrates an example of the SOC-OCV curve on the charge side, and FIG. 7(b) illustrates an example of the SOC-OCV curve on the discharge side. Horizontal axes represent the SOC [%], and vertical axes represent the OCV [V].

Figure 8:
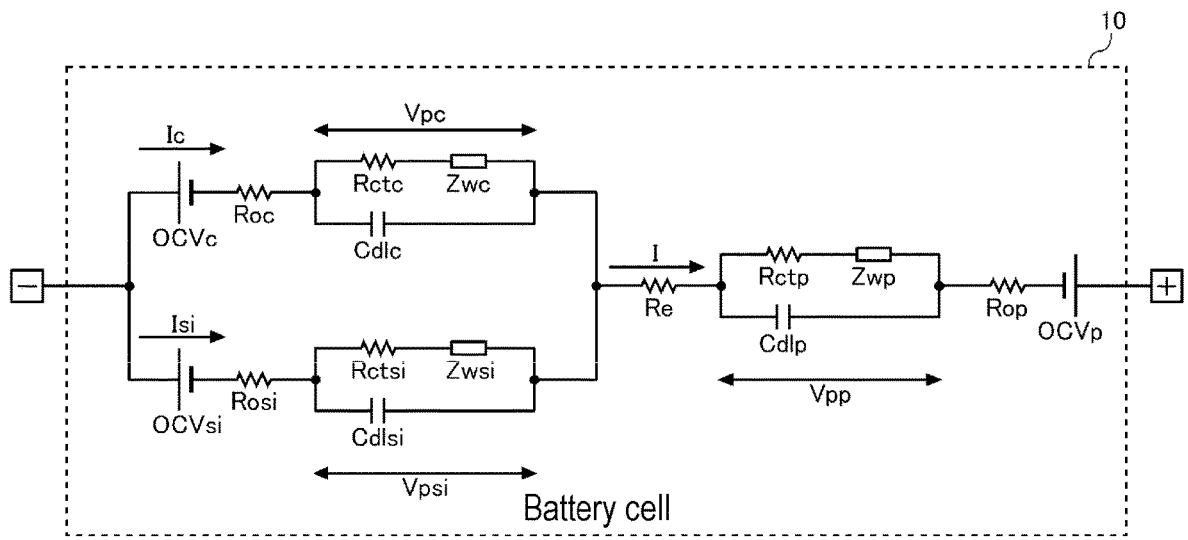
FIG. 8 is a diagram illustrating a third example of the equivalent circuit model of the battery cell according to the present exemplary embodiment.

FIG. 8 is a diagram illustrating a third example of the equivalent circuit model of battery cell 10 according to the present exemplary embodiment. The second example illustrated in FIG. 3 is an equivalent circuit model suitable for a case where the time constant of Zw is sufficiently larger than the time constant according to Cdl, and the third example illustrated in FIG. 8 is an equivalent circuit model suitable for a case where the time constant of Zw is not sufficiently larger than Cdl.

In the equivalent circuit of the positive electrode, combined impedance (Zp) of Rctp, Zwp, and Cdlp excluding OCV_p and Rop is a resistance component involved in polarization. In the equivalent circuit of the graphite (C) negative electrode, combined impedance (Zc) of Rctc, Zwc, and Cdlc excluding OCV_c and Roc is a resistance component involved in polarization. In the equivalent circuit of the silicon (Si) negative electrode, combined impedance (Zsi) of Rctsi, Zwsi, and Cdlsi excluding OCV_si and Rosi is a resistance component involved in polarization. Since the equivalent circuit of the graphite (C) negative electrode and the equivalent circuit of the silicon (Si) negative electrode constitute a parallel circuit, the CCV of the equivalent circuit of the graphite (C) negative electrode and the CCV of the equivalent circuit of the silicon (Si) negative electrode are basically the same.

The CCV of entire battery cell 10 illustrated in FIG. 8 can be defined by the following (Equation 16).

$$CCV = OCV\_p - OCV\_si + Isi*Zsi + Isi*Rosi + I*Zp + I*Rop + I*Re \quad \text{(Equation 16)}$$

The OCV of entire battery cell 10 is derived by OCV_p−OCV_si. Polarization voltage Vpsi of the silicon (Si) negative electrode is derived from Isi*Zsi. Since the equivalent circuit of the graphite (C) negative electrode and the equivalent circuit of the silicon (Si) negative electrode are parallel circuits, relationships in the following (Equation 17) and (Equation 18) are established.

$$I = Ic + Isi \quad \text{(Equation 17)}$$

$$OCV\_c + Ic*Zc + Ic*Roc = OCV\_si + Isi*Zsi + Isi*Rosi \quad \text{(Equation 18)}$$

In order to simplify the calculation, when the previous values are used for portions of Rct, Zw, and Cdl (polarization voltage Vp), the above (Equation 18) is rewritten as the following (Equation 19).

$$OCV\_c + Vpc + Ic*Roc = OCV\_si + Vpsi + Isi*Rosi \quad \text{(Equation 19)}$$

OCV_c can be derived from a lookup table of the Q-OCV curve of the graphite (C) negative electrode, and OCV_si can be derived from a lookup table of the Q-OCV curve of the silicon (Si) negative electrode. The capacity Q_c of the graphite (C) negative electrode and the capacity Q_si of the silicon (Si) negative electrode can be derived from the above (Equation 7) and (Equation 8). The initial capacity of the graphite (C) negative electrode and the initial capacity of the silicon (Si) negative electrode are set so as to have a relationship of OCV_c=OCV_si.

Figure 9:
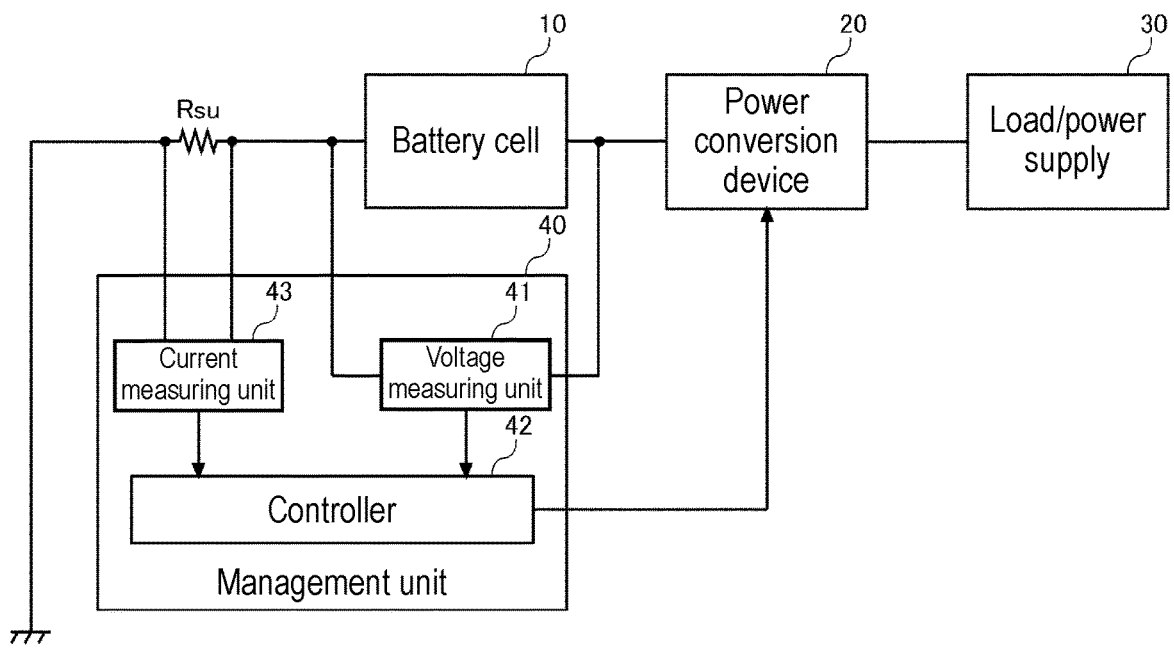
FIG. 9 is a diagram illustrating a basic circuit diagram for explaining charging-discharging of a battery cell according to an exemplary embodiment of the present invention.

FIG. 9 is a basic circuit diagram for explaining the charge-discharge of battery cell 10 according to the exemplary embodiment of the present invention. Battery cell 10 is connected to load/power supply 30 via power conversion device 20. Power conversion device 20 is, for example, a bidirectional inverter or a bidirectional DC/DC converter. Load/power supply 30 is, for example, an AC load, a DC load, an AC power supply, or a DC power supply.

For example, the bidirectional inverter as power conversion device 20 converts, into AC power, DC power discharged from battery cell 10, and supplies the AC load with the converted AC power. Moreover, the bidirectional inverter converts, into DC power, AC power supplied from an AC power supply (for example, a commercial power system or an AC generator), and stores the converted DC power in battery cell 10.

For example, the bidirectional DC/DC converter as power conversion device 20 converts DC power, which is discharged from battery cell 10, into DC power of another voltage, and supplies a DC load (including another storage battery or a capacitor) with the converted DC power. Moreover, the bidirectional DC/DC converter converts DC power, which is supplied from a DC power supply (for example, another storage battery, a capacitor, a solar cell, or a DC generator), into DC power of another voltage, and stores the converted DC power in battery cell 10.

Management unit 40 is a device that manages a state and charge-discharge of battery cell 10. Management unit 40 includes voltage measuring unit 41, controller 42, and current measuring unit 43. Voltage measuring unit 41 measures a voltage across battery cell 10 and outputs the voltage to controller 42. Current measuring unit 43 measures a current, which flows through battery cell 10, based on a voltage across shunt resistor Rsu inserted into a current path of battery cell 10, and outputs the current to controller 42. Note that a Hall element may be used in place of shunt resistor Rsu.

Controller 42 controls the charge-discharge of battery cell 10. Specifically, controller 42 sets a current command value or a voltage command value in power conversion device 20, thereby executing constant current charge (CC charge), constant voltage charge (CV charge), constant current discharge (CC discharge), or constant voltage discharging (CV discharge) of battery cell 10.

Power conversion device 20 includes a switching element, and controls a duty ratio of the switching element based on a current command value or a voltage command value, which is set from controller 42, thereby controlling a charging current, a charging voltage, a discharging current, or a discharging voltage.

Figure 10:
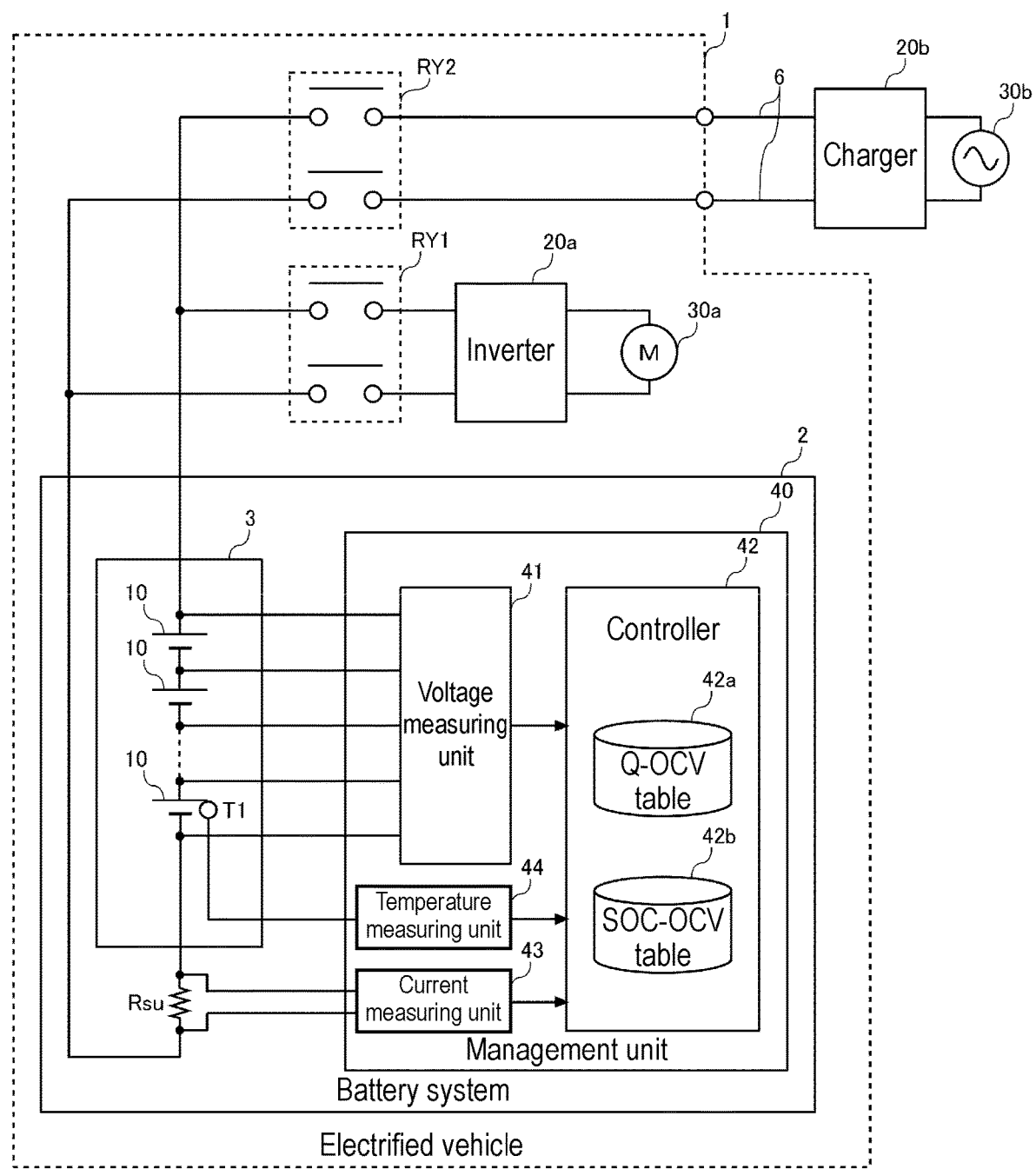
FIG. 10 is a diagram for explaining an electrified vehicle equipped with a battery system according to the exemplary embodiment of the present invention.

FIG. 10 is a diagram for explaining electrified vehicle 1 equipped with battery system 2 according to the exemplary embodiment of the present invention. Electrified vehicle 1 is assumed to be an EV/PHV chargeable from charger 20b installed outside.

Battery system 2 is connected to motor 30a via first relay RY1 and inverter 20a. During power running, inverter 20a converts DC power, which is supplied from battery system 2, into AC power, and supplies motor 30a with the AC power. During regeneration, inverter 20a converts AC power, which is supplied from motor 30a, into DC power, and supplies battery system 2 with the DC power. Motor 30a is a three-phase AC motor, and during power running, rotates according to the AC power supplied from inverter 20a. During regeneration, motor 30a converts rotational energy due to deceleration into AC power, and supplies inverter 20a with the AC power.

First relay RY1 is inserted between wires which connect battery module 3 and inverter 20a to each other. During traveling, management unit 40 of battery system 2 controls first relay RY1 to an on state (closed state), and electrically connects battery system 2 and a power system of electrified vehicle 1 to each other. During stop, in principle, management unit 40 controls first relay RY1 to an off state (open state), and electrically shuts off battery system 2 and the power system of electrified vehicle 1 from each other. Note that another type of switches such as semiconductor switches may be used in place of the relays.

Battery system 2 can be charged from commercial power system 30b by connecting with charging cable 6 to charger 20b installed outside electrified vehicle 1. Charger 20b is installed in a home, a car dealer, a service area, a commercial facility, a public facility, or the like. Charger 20b is connected to commercial power system 30b, and charges battery system 2, which is in electrified vehicle 1, via charging cable 6. In the vehicle, second relay RY2 is inserted between wires which connect battery system 2 and charger 20b to each other. Note that another type of switches such as semiconductor switches may be used in place of the relays. Management unit 40 of battery system 2 controls second relay RY2 to an on state (closed state) before the charge is started, and controls second relay RY2 to an off state (open state) after the charge is completed.

Generally, battery system 2 is charged with AC in the case of normal charge, and is charged with DC in the case of rapid charge. When battery system 2 is charged with AC, AC power is converted into DC power by an AC/DC converter (not shown) inserted between second relay RY2 and battery system 2.

Battery module 3 includes a plurality of battery cells 10. An example of using lithium-ion battery cells (nominal voltage: 3.6 V to 3.7 V) as battery cells 10 will be assumed below. A number of battery cells 10 connected in series is determined according to a driving voltage of motor 30a.

Shunt resistor Rsu is connected in series to the plurality of battery cells 10. Shunt resistor Rsu functions as a current detection element. Note that a Hall element may be used in place of shunt resistor Rsu. Moreover, temperature sensor T1 for detecting temperatures of the plurality of battery cells 10 is installed. For example, a thermistor can be used for temperature sensor T1.

Management unit 40 includes voltage measuring unit 41, controller 42, temperature measuring unit 44, and current measuring unit 43. Voltage measuring unit 41 and respective nodes of the plurality of battery cells 10 connected in series are connected to each other by a plurality of voltage lines. Voltage measuring unit 41 measures each voltage between two adjacent voltage lines, thereby measuring the voltage of each of battery cells 10. Voltage measuring unit 41 transmits the measured voltage of each of battery cells 10 to controller 42.

Since voltage measuring unit 41 has a high voltage with respect to battery controller 42, voltage measuring unit 41 and controller 42 are connected to each other in an insulated state by a communication line. Voltage measuring unit 41 can be composed of a general-purpose analog front-end IC or an application specific integrated circuit (ASIC). Voltage measuring unit 41 includes a multiplexer and an A/D converter. The multiplexer outputs each voltage between two adjacent voltage lines to the A/D converter in order from the top. The A/D converter converts each analog voltage, which is input from the multiplexer, into a digital value.

Temperature measuring unit 44 includes voltage dividing resistors and an A/D converter. The A/D converter converts voltages, which are divided by temperature sensor T1 and the voltage dividing resistors, into digital values, and outputs the digital values to controller 42. Controller 42 estimates the temperatures of the plurality of battery cells 10 based on the digital values.

Current measuring unit 43 includes a differential amplifier and an A/D converter. The differential amplifier amplifies a voltage across shunt resistor Rsu, and outputs the amplified voltage to the A/D converter. The A/D converter converts the voltage, which is input from the differential amplifier, into a digital value, and outputs the digital value to controller 42. Controller 42 estimates a current flowing through the plurality of battery cells 10 based on the digital value.

Note that, when the A/D converter is mounted in controller 42, and an analog input port is installed in controller 42, temperature measuring unit 44 and current measuring unit 43 may output an analog voltage to controller 42, and the analog voltage may be converted into a digital value by the A/D converter in controller 42.

Controller 42 manages battery module 3 based on the voltages, temperatures and currents of the plurality of battery cells 10, which are measured by voltage measuring unit 41, temperature measuring unit 44, and current measuring unit 43. Controller 42 can be composed of a microcomputer and a non-volatile memory (for example, an electrically erasable programmable read-only memory (EEPROM) or a flash memory). Q-OCV table 42a and SOC-OCV table 42b are held in the non-volatile memory.

Q-OCV table 42a is provided for each material for use in the positive electrode and the negative electrode. In the present exemplary embodiment, a Q-OCV table of the positive electrode, a Q-OCV table of the graphite (C) negative electrode, a Q-OCV table of the silicon (Si) negative electrode on the charge side, and a Q-OCV table of the silicon (Si) negative electrode on the discharge side are provided. Moreover, in the present exemplary embodiment, SOC-OCV table 42b has an SOC-OCV table on the charge side of battery cell 10 and an SOC-OCV table on the discharge side thereof, both of which are provided separately from each other.

Controller 42 estimates the OCV of battery cell 10 based on the voltage measured by voltage measuring unit 41, the current measured by current measuring unit 43, and the equivalent circuit model of battery cell 10. As the equivalent circuit model of battery cell 10, the equivalent circuit models illustrated in FIGS. 2, 3 and 8 can be used. The respective parameters which are R, C, and Zw for use in the equivalent circuit models are derived in advance by experiment or simulation. At that time, temperature dependency of each parameter is also derived. Controller 42 adjusts the value of each parameter based on the temperature measured by temperature measuring unit 44.

As mentioned above, in such a model with one diffusion portion as illustrated in FIG. 1, it is difficult to express the waveform of the voltage convergence curve after the charge-discharge is stopped. In contrast, in the present exemplary embodiment, it is possible to calculate the combined voltage according to the diffusion resistance component for each material. For example, the above (Equation 1) is as the following (Equation 20) when I=0.

$$OCV = CCV - Vpp - Vpc - Vpsi \quad \text{(Equation 20)}$$

Controller 42 calculates the OCV of battery cell 10 based on the CCV of battery cell 10, which is measured by voltage measuring unit 41. Since the polarization voltage is obtained for each material, the estimation accuracy of the polarization voltage of entire battery cell 10 is improved, and the OCV can be estimated with high accuracy from the measured CCV even in a state where the polarization voltage does not converge.

Figure 11:
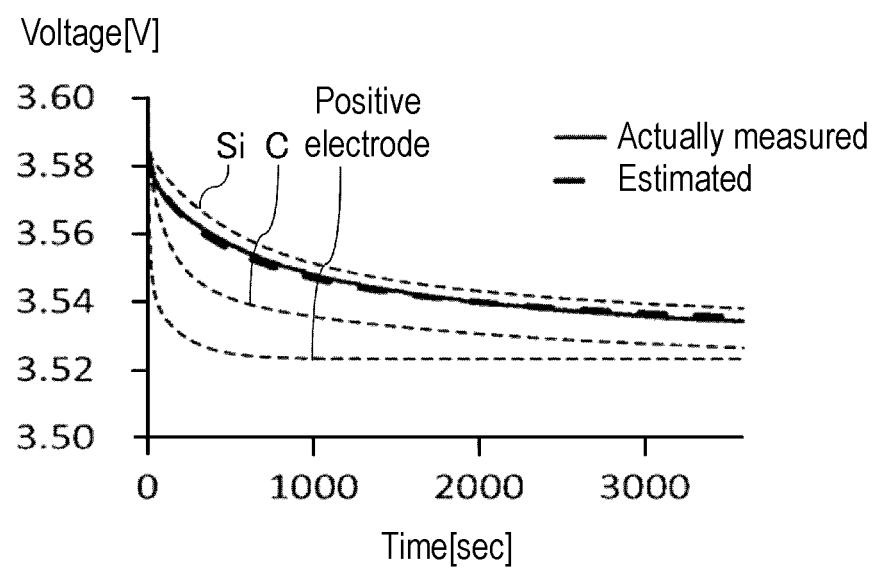
FIG. 11 is a diagram showing an example of a convergence curve of a combined waveform of voltages applied to diffusion resistance components of respective materials.

FIG. 11 is a diagram showing an example of a convergence curve of the combined waveform of the voltages applied to the diffusion resistance components of the respective materials. A top thin dotted line indicates a change in voltage applied to the diffusion component of the silicon (Si) negative electrode, a second thin dotted line indicates a change in voltage applied to the diffusion component of the graphite (C) negative electrode, and a bottom thin dotted line indicates a change in voltage applied to the diffusion component of the positive electrode. A thick solid line indicates an actually measured value of the combined voltage of the three voltages, and a thick dotted line indicates an estimated value of the combined voltage of the three voltages.

As described above, according to the present exemplary embodiment, the diffusion resistance component of the mixed electrode can be accurately expressed by using the equivalent circuit model in which the diffusion resistance component is expressed for each material. Hence, the estimation accuracy of the OCV can be improved. For example, the OCV of battery cell 10 mounted on electrified vehicle 1 that has only a short stop time can also be estimated with high accuracy. Since the OCV can be estimated with high accuracy, the SOC can also be estimated with high accuracy. Note that, according to the present exemplary embodiment, the estimation accuracy of the OCV during the charge-discharge is also improved as well as that after the charge-discharge is stopped. Hence, the estimation accuracy of the SOC during the traveling is also improved. When the estimation accuracy of the SOC is improved, estimation accuracy of a travelable distance is also improved, leading to improvement of electricity efficiency.

In the method disclosed in PTL 1, the equivalent circuit model is expressed as the positive electrode, the negative electrode, the diffusion, and the OCV, and various parameters are estimated using AC impedance analysis (Cole-Cole plot). In this method, a voltage waveform in which a plurality of diffusions by a plurality of materials are superimposed on one another cannot be reproduced. In contrast, in the present exemplary embodiment, since the diffusion is expressed separately for each material, the voltage waveform of the diffusion can be reproduced with high accuracy even if the plurality of diffusions are superimposed on one another, and the estimation accuracy of the OCV can be improved.

In the technique disclosed in PTL 2 described above, a resistance component is expressed while being divided into two parts which are a polarization resistance and a DC resistance, and each part is weighted and averaged with a contribution degree based on empirical values based on a current change. Even in this method, the plurality of diffusion components in the polarization resistance cannot be expressed. In contrast, in the present exemplary embodiment, since the polarization resistance is expressed by the equivalent circuit model based on electrochemistry, a number of parameters based on the empirical values is small, and the estimation accuracy of the OCV can be improved.

The present invention has been described above based on the exemplary embodiment. It will be understood by those skilled in the art that the exemplary embodiment is merely an example, that other exemplary modifications in which the respective constituent elements and processes of the exemplary embodiment are variously combined are possible, and that the other exemplary modifications still fall within the scope of the present invention.

In the above-mentioned exemplary embodiment, a necessary inductance component is not shown in the equivalent circuit model depending on the electrode body structure of the battery cell. However, when it is necessary to show an inductance component, for example, a configuration just needs to be adopted, in which the parallel circuit of inductance L and resistance R is connected in series to the positive electrode or the negative electrode.

In the above-mentioned exemplary embodiment, the lithium-ion battery cell using the mixed negative electrode of graphite (C) and silicon (Si) has been described as an example. The negative electrode material to be mixed is not limited to graphite (C) and silicon (Si). For example, sulfur (S), bismuth (Bi), lithium titanate (Li2TiO3), and the like can be used. Moreover, the materials to be mixed are not limited to two, and may be three or more.

Furthermore, the mixed electrode is not limited to the negative electrode. The positive electrode may also be a mixed positive electrode in which two or more materials are mixed with one another. For example, as the positive electrode material, there can be used a material in which Ni, Mn is substituted for a part of lithium cobaltate (LiCoO2), lithium nickelate (LiNiO2), lithium manganate (LiMn2O4), lithium iron phosphate (LiFePO4), or lithium cobaltate of ternary lithium cobaltate (Li(Ni—Mn—Co)O2), or the like.

In the above-mentioned exemplary embodiment, the example in which the present invention is applied to battery system 2 for in-vehicle use has been described, but the present invention can also be applied to a battery system for use in a stationary power storage. Moreover, the present invention can also be applied to a battery system for use in an electronic device such as a notebook personal computer (PC) and a smartphone.

Note that the exemplary embodiment may be specified by the following items.

[Item 1]

Battery state estimation device (40) including;

voltage measuring unit (41) that measures a voltage of battery cell (10);

current measuring unit (43) that measures a current flowing through battery cell (10); and controller (42) that estimates an open circuit voltage (OCV) of battery cell (10) based on a voltage measured by voltage measuring unit (41), a current measured by current measuring unit (43), and an equivalent circuit model based on electrochemistry of battery cell (10), wherein at least one of a positive electrode and negative electrode of battery cell (10) is a mixed electrode containing a plurality of materials, and the equivalent circuit model is a model including a diffusion resistance component for each of a plurality of materials for use in the positive electrode and the negative electrode.

According to this, the estimation accuracy of the OCV of battery cell (10) using the mixed electrode can be improved.

[Item 2]

Battery state estimation device (40) according to Item 1, wherein the negative electrode is a mixed negative electrode containing a plurality of materials, a negative electrode of the equivalent circuit model is expressed by a parallel circuit of equivalent circuits formed for each of the plurality of materials, and each equivalent circuit includes an OCV and a diffusion resistance component.

According to this, the reactions of the plurality of negative electrode materials can be accurately expressed according to a difference in the OCV curve for each material.

[Item 3]

Battery state estimation device (40) according to Item 1, wherein the negative electrode is a mixed negative electrode containing graphite and silicon, a negative electrode of the equivalent circuit model is expressed by a parallel circuit of an equivalent circuit of the graphite and an equivalent circuit of the silicon, and the equivalent circuit of the graphite and the equivalent circuit of the silicon each include an OCV and a diffusion resistance component.

According to this, the reactions of graphite and silicon can be accurately expressed according to the difference between the OCV curves of the two.

[Item 4]

Battery state estimation device (40) according to any one of Items 1 to 3, wherein, after completion of charge-discharge of battery cell (10), controller (42) estimates the OCV of battery cell (10) based on the voltage measured by voltage measuring unit (41) and a plurality of polarization voltages applied to diffusion resistance components of a plurality of materials for use in the positive electrode and the negative electrode.

According to this, the OCV after the completion of the charge-discharge of battery cell (10) can be estimated with high accuracy even in a state where the polarization voltage does not converge.

[Item 5]

A battery state estimation method comprising the steps of;

measuring a voltage of battery cell (10);

measuring a current flowing through battery cell (10); and estimating an open circuit voltage (OCV) of battery cell (10) based on a voltage measured in the step of measuring the voltage, a current measured in the step of measuring the current, and an equivalent circuit model based on electrochemistry of battery cell (10), wherein at least one of a positive electrode and negative electrode of battery cell (10) is a mixed electrode containing a plurality of materials, and the equivalent circuit model is a model including a diffusion resistance component for each of a plurality of materials for use in the positive electrode and the negative electrode.

According to this, the estimation accuracy of the OCV of battery cell (10) using the mixed electrode can be improved.

[Item 6]

Battery system (2) including:

battery cell (10);

voltage measuring unit (41) that measures a voltage of battery cell (10);

current measuring unit (43) that measures a current flowing through battery cell (10); and controller (42) that estimates an open circuit voltage (OCV) of battery cell (10) based on a voltage measured by voltage measuring unit (41), a current measured by current measuring unit (43), and an equivalent circuit model based on electrochemistry of battery cell (10), wherein at least one of a positive electrode and negative electrode of battery cell (10) is a mixed electrode containing a plurality of materials, and the equivalent circuit model is a model including a diffusion resistance component for each of a plurality of materials for use in the positive electrode and the negative electrode.

According to this, battery system (2) in which the estimation accuracy of the OCV of battery cell (10) using the mixed electrode is improved can be achieved.

REFERENCE MARKS IN THE DRAWINGS 10 battery cell
20 power conversion device
30 load/power supply
1 electrified vehicle
2 battery system
3 battery module
6 charging cable
40 management unit
41 voltage measuring unit
42 controller
42a Q-OCV table
42b SOC-OCV table
43 current measuring unit
44 temperature measuring unit
20a inverter
30a motor
20b charger
30b commercial power system
RY1 first relay
RY2 second relay
Rsu shunt resistor

The invention claimed is:

1. A battery state estimation device comprising:
a voltage measuring unit that measures a voltage of a battery cell;
a current measuring unit that measures a current flowing through the battery cell; and
a controller that estimates an open circuit voltage (OCV) of the battery cell based on a voltage measured by the voltage measuring unit, a current measured by the current measuring unit, and an equivalent circuit model based on electrochemistry of the battery cell, wherein:
at least one of a positive electrode or negative electrode of the battery cell is a mixed electrode containing a plurality of materials,
the equivalent circuit model is a model including a diffusion resistance component for each of the plurality of materials in the mixed electrode, and
after completion of charging-discharging of the battery cell, the controller estimates the OCV of the battery cell based on the voltage measured by the voltage measuring unit and a plurality of polarization voltages applied to diffusion resistance components of the plurality of materials in the mixed electrode.

2. The battery state estimation device according to claim 1, wherein
the negative electrode is a mixed negative electrode containing the plurality of materials,
a negative electrode of the equivalent circuit model is expressed by a parallel circuit of equivalent circuits formed for each of the plurality of materials, and
each of the equivalent circuits includes an OCV and a diffusion resistance component.

3. The battery state estimation device according to claim 1, wherein
the negative electrode is a mixed negative electrode containing graphite and silicon,
a negative electrode of the equivalent circuit model is expressed by a parallel circuit of an equivalent circuit of the graphite and an equivalent circuit of the silicon, and
the equivalent circuit of the graphite and the equivalent circuit of the silicon each include an OCV and a diffusion resistance component.

4. A battery state estimation method comprising steps of:
measuring a voltage of a battery cell;
measuring a current flowing through the battery cell; and
estimating an open circuit voltage (OCV) of the battery cell based on a voltage measured in the step of measuring the voltage, a current measured in the step of measuring the current, and an equivalent circuit model based on electrochemistry of the battery cell, wherein:
at least one of a positive electrode or negative electrode of the battery cell is a mixed electrode containing a plurality of materials,
the equivalent circuit model is a model including a diffusion resistance component for each of the plurality of materials in the mixed electrode, and
after completion of charging-discharging of the battery cell, the OCV of the battery cell is estimated based on the voltage measured by the voltage measuring unit and a plurality of polarization voltages applied to diffusion resistance components of the plurality of materials in the mixed electrode.

5. A battery system comprising:
a battery cell;
a voltage measuring unit that measures a voltage of a battery cell;
a current measuring unit that measures a current flowing through the battery cell; and
a controller that estimates an open circuit voltage (OCV) of the battery cell based on a voltage measured by the voltage measuring unit, a current measured by the current measuring unit, and an equivalent circuit model based on electrochemistry of the battery cell, wherein:

at least one of a positive electrode or negative electrode of the battery cell is a mixed electrode containing a plurality of materials, the equivalent circuit model is a model including a diffusion resistance component for each of the plurality of materials in the mixed electrode, and after completion of charging-discharging of the battery cell, the controller estimates the OCV of the battery cell based on the voltage measured by the voltage measuring unit and a plurality of polarization voltages applied to diffusion resistance components of the plurality of materials in the mixed electrode.

* * * * *